United States Patent
Hu et al.

(10) Patent No.: US 11,450,294 B2
(45) Date of Patent: Sep. 20, 2022

(54) SHIFT REGISTER, GATE DRIVING CIRCUIT AND DRIVING METHOD FOR THE SAME, AND LIQUID CRYSTAL DISPLAY

(71) Applicants: Hefei Xinsheng Optoelectronics Technology Co., Ltd., Anhui (CN); Beijing BOE Technology Development Co., Ltd., Beijing (CN)

(72) Inventors: Shenghua Hu, Beijing (CN); Chunyang Nie, Beijing (CN); Bingbing Yan, Beijing (CN)

(73) Assignees: Hefei Xinsheng Optoelectronics Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 842 days.

(21) Appl. No.: 16/316,236

(22) PCT Filed: Feb. 1, 2018

(86) PCT No.: PCT/CN2018/074952
§ 371 (c)(1),
(2) Date: Jan. 8, 2019

(87) PCT Pub. No.: WO2019/007049
PCT Pub. Date: Jan. 10, 2019

(65) Prior Publication Data
US 2021/0375227 A1    Dec. 2, 2021

(30) Foreign Application Priority Data
Jul. 3, 2017   (CN) .......................... 201710531211.1

(51) Int. Cl.
*G09G 3/36*     (2006.01)
*G11C 19/28*    (2006.01)

(52) U.S. Cl.
CPC .......... *G09G 3/3677* (2013.01); *G11C 19/28* (2013.01); *G09G 2310/0286* (2013.01); *G09G 2310/062* (2013.01)

(58) Field of Classification Search
CPC ......... G09G 3/3677; G09G 2310/0286; G09G 2310/062; G11C 19/28
See application file for complete search history.

(56) References Cited

U.S. PATENT DOCUMENTS

2007/0296681 A1* 12/2007 Kim ..................... G11C 19/184
                                                                345/100
2010/0214279 A1    8/2010 Kim et al.
(Continued)

FOREIGN PATENT DOCUMENTS

CN    104575353 A    4/2015
CN    104575437 A    4/2015
(Continued)

OTHER PUBLICATIONS

May 3, 2018—(WO) International Search Report and Written Opinion Appn PCT/CN2018/074952 with English Translation.

*Primary Examiner* — Stephen G Sherman
(74) *Attorney, Agent, or Firm* — Banner & Witcoff, Ltd.

(57) ABSTRACT

A shift register, a gate driving circuit and a driving method for the same, and a liquid crystal display. The shift register includes: a pull-up sub-circuit configured to set a potential at a pull-up node to an operating potential when a first input signal is received via a first input terminal; a first output sub-circuit configured to output a gate driving signal at an output terminal according to a first clock signal received via a first clock signal terminal when the potential at the pull-up node is the operating potential; and a second output sub-circuit configured to output a gate driving signal at the output terminal when a second input signal is received via a
(Continued)

second input terminal during a period other than a duration in which one frame of picture is displayed.

12 Claims, 5 Drawing Sheets

(56) References Cited

U.S. PATENT DOCUMENTS

| | | |
|---|---|---|
| 2016/0189586 A1 | 6/2016 | Zou et al. |
| 2017/0039987 A1 | 2/2017 | Yao et al. |
| 2017/0206852 A1 | 7/2017 | Liu et al. |
| 2018/0061508 A1 | 3/2018 | Chen et al. |

FOREIGN PATENT DOCUMENTS

| | | |
|---|---|---|
| CN | 104616618 A | 5/2015 |
| CN | 104934007 A | 9/2015 |
| CN | 105185293 A | 12/2015 |
| CN | 105405387 A | 3/2016 |
| CN | 105590612 A | 5/2016 |
| CN | 106486085 A | 3/2017 |
| CN | 107134268 A | 9/2017 |
| KR | 1020080060824 A | 7/2008 |

\* cited by examiner

SHIFT REGISTER, GATE DRIVING CIRCUIT AND DRIVING METHOD FOR THE SAME, AND LIQUID CRYSTAL DISPLAY

The application is a U.S. National Phase Entry of International Application No. PCT/CN2018/074952 filed on Feb. 1, 2018, designating the United States of America and claiming priority to Chinese Patent Application No. 201710531211.1, filed on Jul. 3, 2017. The present application claims priority to and the benefit of the above-identified applications and the above-identified applications are incorporated by reference herein in their entirety.

TECHNICAL FIELD

The present disclosure relates to a shift register, a gate driving circuit and a driving method for the same, and a liquid crystal display.

BACKGROUND

A liquid crystal display displays a picture by causing liquid crystal to continuously deflect. Liquid crystal usually has a capacitance parameter, and an equivalent capacitor of liquid crystal is also referred to as a liquid crystal capacitor. In addition, a storage capacitor is also typically provided between the pixel electrode and the common electrode to maintain a voltage that is used to deflect the liquid crystal. Liquid crystal is deflected according to the charge stored in the liquid crystal capacitor and the storage capacitor.

SUMMARY

According to one aspect of the present disclosure, there is provided a shift register, comprising: a pull-up sub-circuit coupled to a first input terminal and a pull-up node of the shift register, and configured to set a potential at the pull-up node to an operating potential when a first input signal is received via the first input terminal; a first output sub-circuit coupled to the pull-up node, a first clock signal terminal and an output terminal of the shift register, and configured to output a first gate driving signal at the output terminal according to a first clock signal received via the first clock signal terminal when the potential at the pull-up node is the operating potential; and a second output sub-circuit coupled to a second input terminal and the output terminal of the shift register, and configured to output a second gate driving signal at the output terminal when a second input signal is received via the second input terminal during a period other than a duration in which one frame of picture is displayed.

In an embodiment, the shift register may further comprise: a reset sub-circuit coupled to a reset terminal, the pull-up node and the output terminal of the shift register, and configured to set potentials at the pull-up node and the output terminal to a reset potential when a reset signal is received via the reset terminal.

In an embodiment, the second output sub-circuit may comprise: a first output switching element, a control terminal, a first terminal and a second terminal of which are coupled to the second input terminal, the output terminal and an operating potential terminal of the shift register, respectively.

In an embodiment, the second output sub-circuit may further comprise: a first pull-down switching element, a control terminal, a first terminal and a second terminal of which are coupled to the second input terminal, a reset potential terminal and the pull-up node of the shift register, respectively.

In an embodiment, the second output sub-circuit further comprises: a second pull-down switching component, a control terminal, a first terminal and a second terminal of which are coupled to the second input terminal, a reset potential terminal and a pull-down node of the shift register, respectively.

In an embodiment, the pull-up sub-circuit may comprise: a first pull-up switching element, a control terminal, a first terminal and a second terminal of which are coupled to the first input terminal, a second clock signal terminal and the pull-up node of the shift register, respectively.

In an embodiment, the pull-up sub-circuit may further comprise: a second pull-up switching element, a control terminal, a first terminal and a second terminal of which are coupled to the first input terminal, a reset potential terminal and a pull-down node of the shift register, respectively.

In an embodiment, the first output sub-circuit may comprise: a second output switching element, a control terminal, a first terminal and a second terminal of which are coupled to the pull-up node, the first clock signal terminal and the output terminal of the shift register, respectively; and a capacitor connected between the pull-up node and the output terminal.

In an embodiment, the reset sub-circuit may comprise: a first reset switching element, a control terminal, a first terminal and a second terminal of which are coupled to the reset terminal, a reset potential terminal and the pull-up node of the shift register, respectively; and a second reset switching element, a control terminal, a first terminal and a second terminal of which are coupled to a pull-down node, a reset potential terminal and the output terminal of the shift register, respectively.

In an embodiment, the reset sub-circuit may further comprise: a third reset switching element, a control terminal, a first terminal and a second terminal of which are coupled to the reset terminal, an operating potential terminal and the pull-down node of the shift register, respectively.

In an embodiment, any one of the switching elements described above may be turned on when the potential at the control terminal thereof is an operating potential, so that the potentials at the first terminal and the second terminal thereof are the same or approximately the same.

In an embodiment, any one of the switching elements described above may be a transistor, wherein a gate of the transistor serves as the control terminal of the switching element, one of a source and a drain of the transistor serves as the first terminal of the switching element, and the other of a source and a drain of the transistor serves as the second terminal of the switching element.

In an embodiment, the operating potential may be a high voltage level and the reset potential may be a low voltage level.

According to another aspect of the present disclosure, there is provided a gate driving circuit, comprising a plurality of cascaded shift registers described above.

According to another aspect of the present disclosure, there is provided a liquid crystal display, comprising the gate driving circuit described above.

According to another aspect of the present disclosure, there is provided a driving method for the gate driving circuit as described above, comprising: during a period other than a duration in which one frame of picture is displayed, supplying a second input signal to second input terminals of all the shift registers in the gate driving circuit, and outputting, by each of all the shift registers, a second gate driving signal at its output terminal within said period in response to the second input signal received via its second input terminal.

DETAILED DESCRIPTION OF THE EMBODIMENTS

During displaying of different pictures, the liquid crystal capacitor and the storage capacitor will be charged and discharged multiple times. As the refresh rate of the display device increases, charging and discharging of the liquid crystal capacitor and the storage capacitor are also faster and faster. Accordingly, charging time and discharging time of the liquid crystal capacitor and the storage capacitor also become shorter and shorter. There may be residual charge in the liquid crystal capacitor and the storage capacitor due to insufficient charging time and insufficient discharging time, thus resulting in phenomenon such as afterimage, jitter, and flickering at the time of powering on/off.

Figure 1:
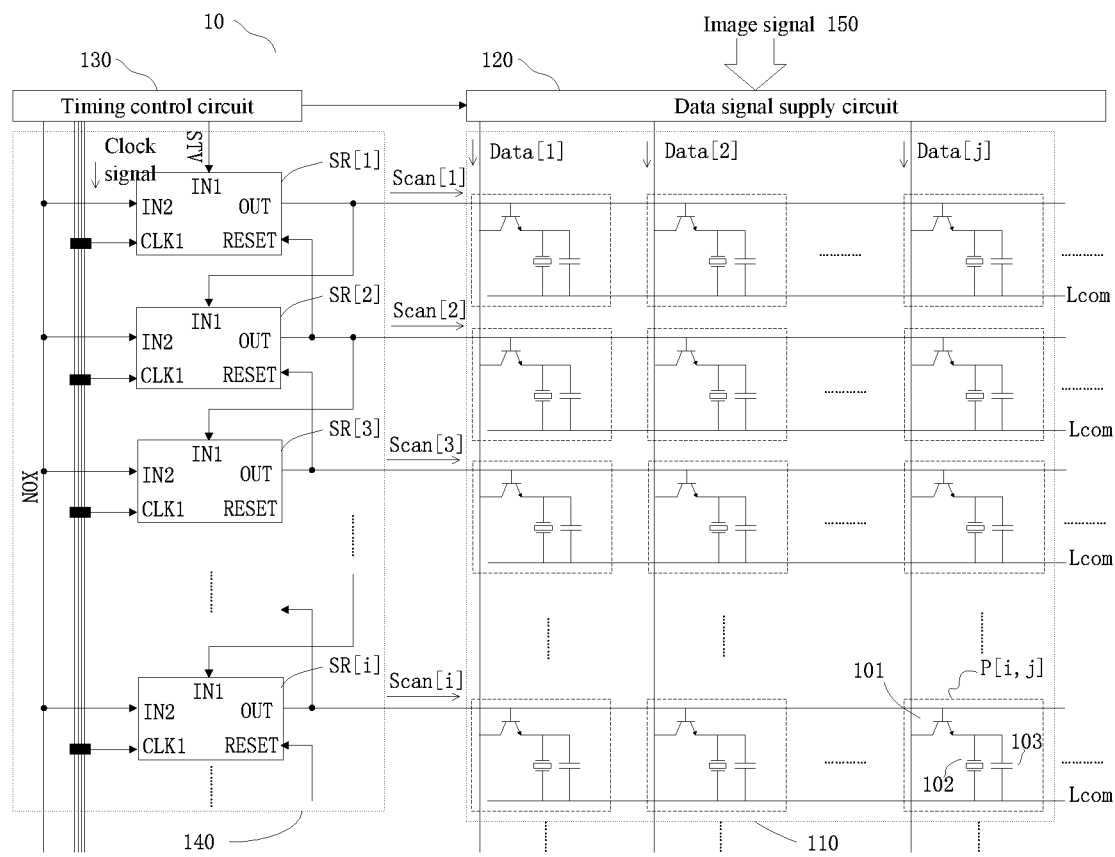
FIG. 1 illustrates an example configuration of a liquid crystal display according to an embodiment of the present disclosure.

FIG. 1 illustrates an example configuration of a liquid crystal display 10 according to an embodiment of the present disclosure. As shown in FIG. 1, the liquid crystal display 10 comprises a display area 110, a data signal supply circuit 120, a timing control circuit 130 and a gate driving circuit 140, wherein the display area 110 is a pixel array including a plurality of pixel cells (e.g., pixel cells P[i,j]), and the gate driving circuit 140 is constituted by a plurality of cascaded shift registers SR[1], SR[2], . . . , SR[i]. The data signal supply circuit 120 receives an image signal 150 and supplies data signals Data[1], Data[2], . . . , Data[j] (j is a positive integer) to a plurality of pixel cells disposed on respective columns in the display area 110 via corresponding data lines, respectively. The gate driving circuit 140 is coupled to the timing control circuit 130 to receive a desired clock signal and signals such as a frame start signal STV and a control signal XON, and is configured to supply the gate driving signals Scan[1], Scan[2], . . . , Scan[i] to a plurality of pixel cells disposed on respective rows in the display area 110 via corresponding scan lines, respectively.

As shown in FIG. 1, the gate driving circuit 140 comprises a plurality of shift registers SR[1], SR[2], . . . , SR[i] (i is a positive integer) that are cascaded together. A first input terminal IN1 of the shift register SR[1] cascaded at a first stage receives, for example, a frame start signal STV from the timing control circuit 130. A first input terminal IN1 of the shift register SR[i] cascaded at a stage other than the first stage receives a gate driving signal Scan[i−1] from an output terminal OUT of the shift register SR[i−1] cascaded in its previous stage, as its first input signal. A reset terminal RESET of the shift register SR[i] at each stage other than a last stage receives a gate driving signal Scan[i+1] from an output terminal OUT of the shift register SR[i+1] cascaded at its next stage, as its reset signal. For example, in the gate driving circuit 140 shown in FIG. 1, the input terminal IN1 of the shift register SR[2] cascaded at the second stage receives the gate driving signal Scan[1] from the output terminal OUT of the shift register SR[1] cascaded at the first stage, as its first input signal; and the reset terminal RESET of the shift register SR[2] cascaded at the second stage receives the gate driving signal Scan[3] from the output terminal OUT of the shift register SR[3] cascaded at the third stage, as its reset signal. For each shift register SR[i] in the gate driving circuit 140, its second input terminal IN2 receives, for example, a control signal XON from the timing control circuit 130, as its second input signal; and a first clock signal terminal CLK1 of each shift register SR[i] receives a corresponding first clock signal from the timing control circuit 130.

In an example, two types of first clock signal may be supplied to the first clock signal terminals CLK1 of the shift registers in the gate driving circuit 140, respectively. Specifically, a first type of first clock signal is supplied to the first clock signal terminal CLK1 of the shift register SR[i] cascaded at the i-th stage, a second type of first clock signal is supplied to the shift register SR[i+1] cascaded at the (i+1)-th stage, and phases of the two types of first clock signal may be opposite to each other. In another example, many more types of first clock signal may be supplied to the first clock signal terminals CLK1 of the shift registers in the gate driving circuit 140, respectively, as needed. For example, in the case where three types of first clock signal are supplied, a duty ratio of each of three first clock signals respectively supplied to the shift register SR[i], the shift register SR[i+1] and the shift register SR[i+2] may be set to ⅓, and their phases sequentially differ by a ⅓ clock cycle. Similarly, a wider variety of first clock signal may be supplied to the first clock signal terminals CLK1 of the shift registers in the gate driving circuit 140, respectively.

However, the gate driving circuit 140 shown in FIG. 1 is just an example. In other embodiments, the shift registers included in the gate driving circuit 140 may adopt other cascading manners. For example, in an example, first input terminals of shift registers SR[1] and SR[2] may each receive the frame start signal STV, and first input terminals IN1 of shift registers SR[2i+1] and SR[2i+2] other than shift registers SR[1] and SR[2] are made to be coupled to output terminals OUT of shift registers SR[2i−1] and SR[2i], respectively; then output terminals OUT of shift register SR[2i+1] and SR[2i+2] are made to be coupled to reset terminals RESET of shift registers SR[2i−1] and SR[2i], respectively. Such cascading manner is equivalent to including two groups of shift registers cascaded separately in the gate driving circuit 140. In this example, for example, the timing control circuit 130 may be configured to supply four types of first clock signal to the gate driving circuit 140, wherein the first and second types of first clock signal are supplied to shift registers SR[2i−1], the third and fourth types of first clock signal are supplied to the shift registers SR[2i], and duty ratios of the four types of first clock signal may be all set to ¼, and their phases sequentially differ by a ¼ clock cycle. Similarly, in other embodiments, for example, more groups of shift registers may be adopted, and for example, how many types of first clock signal need to be supplied can be determined based on the number of groups of shift registers provided.

As shown in FIG. 1, in the display area 110, a scan line for supplying the gate driving signal Scan[i] extends in a row direction, and a data line for supplying the data signal Data[j] extends in a column direction. The scan line and the data line may be electrically insulated. The pixel cell P[i,j] is disposed associated with the scan line in the i-th row connected thereto and the data line in the j-th column connected thereto. Thus, in the example shown in FIG. 1, the pixel cells in the display area 110 are arranged in the form of a matrix, wherein the pixel cell P[i, j] located in the i-th row and the j-th column receives the gate driving signal Scan[i] from the scan line in the i-th row, and receives the data signal Data[j] from the data line in the j-th column.

As shown in FIG. 1, an equivalent circuit of each pixel cell P[i, j] in the display area 110 may include a switching element 101, a liquid crystal capacitor 102 and a storage capacitor 103. A control terminal of the switching element 101 is coupled to the scan line in the i-th row, a first terminal of the switching element 101 is coupled to the data line in the j-th column, and a second terminal of the switching element 101 is coupled to a first end (the pixel electrode) of the liquid crystal capacitor 102 and a first end of the storage capacitor 103 in the pixel cell P[i,j]. The switching element 101 may be various types of elements with a control terminal, such as a thin film transistor, an MOS transistor, and the like. Further, for example, whether an effective voltage level of the gate driving signal Scan[i] is a high voltage level or a low voltage level may be determined according to the type of the switching element 101 selected. A second end (the common electrode) of the liquid crystal capacitor 102 and a second end of the storage capacitor 103 are coupled to a line Lcom that supplies a common voltage. For example, the switching element 101 may be turned on when the control terminal thereof receives the gate driving signal Scan[i], thereby supplying the data signal Data[j] to the first end (the pixel electrode) of the liquid crystal capacitor 102 and the first end of the storage capacitor 103.

The pixel cells in the display unit 110 may also adopt other arrangement manners, and the pixel cells in the display unit 110 may also have other forms of equivalent circuit structure. For example, in an example, the second terminal of the storage capacitor 103 may be directly grounded. The present disclosure is not limited to the arrangement manner and the equivalent circuit structure of the pixel cells shown in FIG. 1.

For the liquid crystal display 10 shown in FIG. 1, during a duration in which one frame of picture is displayed, in the gate driving circuit 140, the shift register SR[1] cascaded at the first stage may first receive the frame start signal STV via its first input terminal IN1. Then, stage by stage, the shift register SR[i] in the gate driving circuit 140 may output the gate driving signal Scan[i] to the scan line in the i-th row, under control of the first clock signal supplied from the timing control circuit 130. The data signal supply circuit 120 may supply the data signal Data[j] of each column to the pixel cells in the corresponding column in the display area 110 according to the received image signal 150 under control of the timing control circuit 130. The switching element 101 in the pixel cell P[i, j] located in the i-th row and the j-th column is turned on when receiving the gate driving signal Scan [i] from the scan line in the i-th row, thereby supplying the data signal Data[j] to the first ends of the liquid crystal capacitor 102 and the storage capacitor 103 in the pixel cell P[i, j], so that the liquid crystal capacitor 102 and the storage capacitor 103 are charged or discharged accordingly. Liquid crystal is deflected by the electric field formed between the pixel electrode and the common electrode, and the deflected state is kept by the charge stored in the liquid crystal capacitor 102 and the storage capacitor 103, thus achieving the corresponding display function.

During a period other than a duration in which one frame of picture is displayed, for example, between two frames (e.g., during a blanking period between two frames) and/or before powering on and/or after powering off, the timing control circuit 130 may supply a control signal XON to second input terminals IN2 of all the shift registers SR[i] in the gate driving circuit 140, so that all the shift registers SR[i] in the gate driving circuit 140 output gate driving signals Scan [i] during this period, and thus the switching elements in all the pixel cells in the display area 110 are turned on. In the meantime, the data signal supply circuit 120 may supply the data signal Data' [i] (not shown in FIG. 1) to the data line under control of the timing control circuit 130. In an example, the data signal Data' [i] may be made to have the same voltage as the voltage supplied to the common electrode of P[i,j] (e.g., the voltage supplied via the line Lcom in FIG. 1). Accordingly, the pixel electrode and the common electrode of all the pixel cells P[i, j] in the display area can have the same voltage, thereby causing the pixel capacitor 102 and the storage capacitor 103 in all the pixel cells P[i, j] in the display area can be sufficiently discharged during this period. All the shift registers SR[i] in the gate driving circuit 140 may be made to supply the gate driving signals Scan[i] to the pixel cells of the corresponding rows simultaneously or not simultaneously during this period, as needed.

For convenience of description, hereinafter, a high voltage level is selected as an operating potential or an active voltage level, a low voltage level is selected as a reset potential or an inactive voltage level, and respective switching elements involved in the following description are selected accordingly as the switching elements that are turned on when the control terminals thereof receive a high voltage level, and potentials at the first terminals and the second terminals thereof are made to be the same or approximately the same; and it is assumed that all the shift registers SR[i] in the gate driving circuit 140 have the same circuit structure. However, the present disclosure is not limited to such example and assumption, for example, respective switching elements may be selected as switching elements that have a low voltage level as an operating potential or an active voltage level, and all the shift registers SR[i] in the gate driving circuit 140 may have different circuit structures, and so on.

Figure 2:
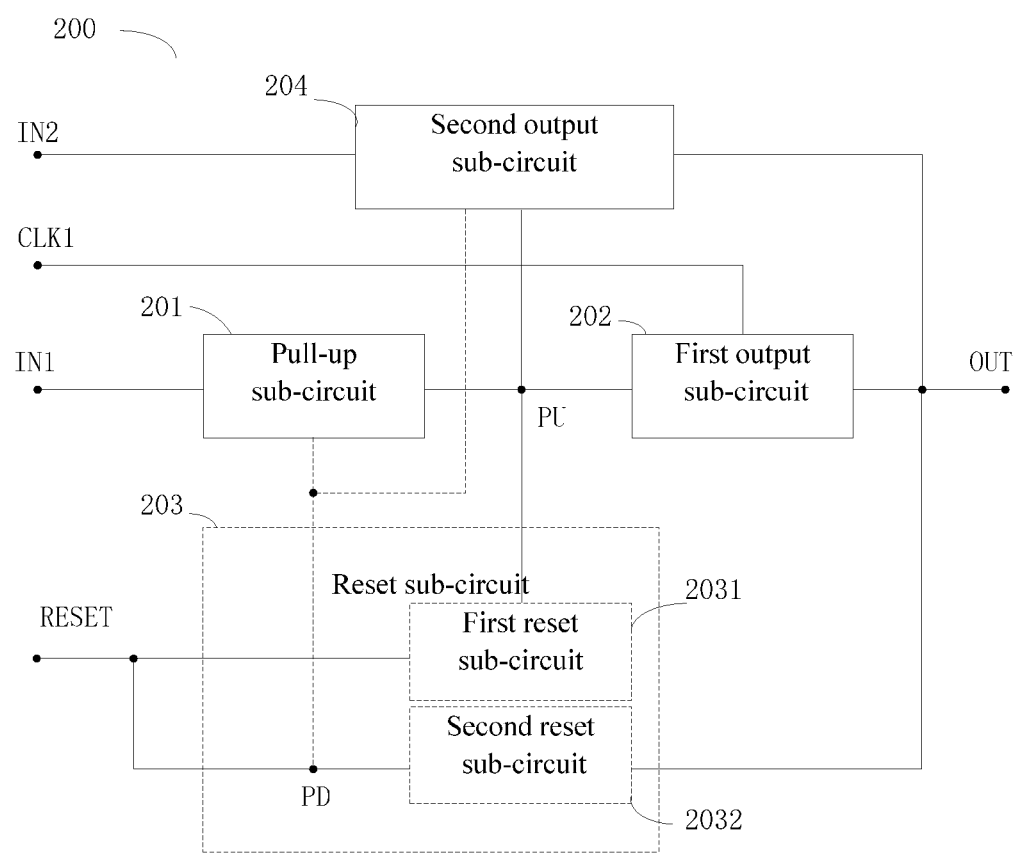
FIG. 2 illustrates a block diagram of a shift register according to an embodiment of the present disclosure.

FIG. 2 illustrates a block diagram 200 of a shift register SR[i] according to an embodiment of the present disclosure. As shown in FIG. 2, the shift register SR[i] according to an embodiment of the present disclosure may comprise a pull-up sub-circuit 201, a first output sub-circuit 202 and a second output sub-circuit 204.

The pull-up sub-circuit 201 is coupled to a first input terminal IN1 and a pull-up node PU of the shift register SR[i]. The pull-up sub-circuit 201 sets a potential at the pull-up node PU to a high voltage level when an input signal (i.e., the first input signal) is received via the first input terminal IN1.

In an example, the pull-up sub-circuit 201 may comprise a switching element. For example, a control terminal of the switching element and a first terminal thereof may be connected together as the first input terminal IN1 of the shift register SR[i] or they may be connected together to the first input terminal IN1 of the shift register SR[i], and a second terminal of the switching element is coupled to the pull-up node PU. The control terminal of the switching element may also be used as the first input terminal IN1 of the shift register SR[i] or coupled to the first input terminal IN1 of the shift register SR[i], and the potential at the first terminal of the switching element is set to a high voltage level (e.g., it may be coupled to an operating potential terminal of the shift register SR[i] so that its potential is always at a high voltage level), and the second terminal of the switching element is coupled to the pull-up node PU. The control terminal of the switching element may also serve as the first input terminal IN1 of the shift register SR[i] or be coupled to the first input terminal IN1 of the shift register SR[i], the first terminal of the switching element is coupled to a second clock signal terminal of the shift register SR[i], the second terminal of the switching element is coupled to the pull-up node PU, and when the first input signal is received at the control terminal of the switching element via the first input terminal IN1, the first terminal of the switching element is made to receive a clock signal or a control signal at a high voltage level via the second clock signal terminal. In other examples, the pull-up sub-circuit 201 may also adopt a more complex circuit structure or other circuit structure. The present disclosure is not limited to the implementation manner of the pull-up sub-circuit 201. An example of the pull-up sub-circuit 201 will be described below in conjunction with FIG. 3.

The first output sub-circuit 202 is coupled to the pull-up node PU, the first clock signal terminal CLK1 and the output terminal OUT of the shift register SR[i]. When the potential at the pull-up node PU becomes a high voltage level because the pull-up sub-circuit 201 receives the first input signal via the first input terminal IN1, no first clock signal is supplied at the first clock signal terminal CLK1, or the potential of the first clock signal received via the first clock signal terminal CLK1 is a low voltage level. At this time, the first output sub-circuit 202, in response to that the potential at the pull-up node PU becomes a high voltage level, latches the first input signal and keeps the potential at the pull-up node PU at a high voltage level, without outputting the gate driving signal Scan[i] at the output terminal OUT. Next, the first output sub-circuit 202 receives the first clock signal via the first clock signal terminal CLK1, and outputs the gate driving signal Scan[i] at the output terminal OUT in response to the received first clock signal.

In an example, the first output sub-circuit 202 may comprise a switching element and a capacitor. For example, one end of the capacitor may be coupled to a control terminal of the switching element and to the pull-up node PU; a first terminal of the switching element is coupled to the first clock signal terminal CLK1 of the shift register SR[i], or serves as the first clock signal terminal CLK1 of the shift register SR[i]; and the other end of the capacitor is coupled to a second terminal of the switching element and to the output terminal OUT of the shift register SR[i] or used as the output terminal OUT of the shift register SR[i]. When the pull-up sub-circuit 201 receives the first input signal via the first input terminal IN1, no first clock signal is supplied at the first clock signal terminal CLK1, or the potential of the first clock signal received via the first clock signal terminal CLK1 is a low voltage level. At this time, the potential at the pull-up node PU becomes a high voltage level because the pull-up sub-circuit 201 receives the first input signal via the first input terminal IN1. The capacitor in the first output sub-circuit 202 starts to be charged in response to that the potential at the pull-up node PU becomes a high voltage level, thereby achieving latching of the first input signal. The switching element in the first output sub-circuit 202 is turned on because the potential at the pull-up node PU becomes a high voltage level. At this time, the potential at the first terminal of the switching element coupled to the first clock signal terminal CLK is a low voltage level, so the potential at the second terminal coupled to the output terminal OUT is also a low voltage level, that is, there is no gate driving signal Scan[i] outputted at the output terminal OUT. Thereafter, the capacitor keeps the potential at the pull-up node PU at a high voltage level by the bootstrap effect, and also keeps the switching element in the first output sub-circuit 202 in a turned-on state. Subsequently, when the first clock signal is received via the first clock signal terminal CLK1, the potential at the second terminal of the switching element coupled to the output terminal OUT becomes a high voltage level, thereby outputting the gate driving signal Scan[i] at the output terminal OUT. The first output sub-circuit 202 may also achieve the above function by adopting a more complicated circuit structure or adopting other circuit structures. The present disclosure does not limit implementation manner of the first output sub-circuit 202. An example of the first output sub-circuit 202 will be described below in conjunction with FIG. 3.

As shown in FIG. 2, the shift register SR[i] according to an embodiment of the present disclosure is further provided with a second input terminal IN2, and further comprises a second output sub-circuit 204. The second output sub-circuit 204 is coupled to a second input terminal IN2 and the output terminal OUT of the shift register SR[i], and outputs a gate driving signal Scan[i] at the output terminal OUT when a second input signal is received via the second input terminal IN2. In an example, the second output sub-circuit 204 immediately outputs the gate driving signal Scan[i] at the output terminal OUT in response to receiving the second input signal via the second input terminal IN2.

In an example, the second output sub-circuit 204 may comprise a switching element, a control terminal of the switching element may be coupled to the second input terminal IN2 of the shift register SR[i] or serve as the second input terminal IN2 of the shift register SR[i], a first terminal of the switching element may be coupled to the output terminal OUT of the shift register SR[i], and the potential at a second terminal thereof may be set to remain at a high voltage level (e.g., coupled to an operating potential terminal of the shift register SR[i]). Accordingly, the control terminal of the switching element is turned on when receiving the second input signal, and the potential at the output terminal OUT is made to a high voltage level, thereby outputting the gate driving signal Scan[i] at the output terminal OUT.

In another example, in the second output sub-circuit 204, a corresponding switching element may also be provided for the pull-up node PU of the shift register SR[i]. For example, a control terminal and a first terminal of the switching element may be coupled to the second input terminal IN2 and the pull-up node PU of the shift register SR[i] respectively, and the potential at a second terminal of the switching element is set to remain at a low voltage level (e.g., coupled to a reset potential terminal of the shift register SR[i]). As such, when the second input signal is received via the second input terminal IN2, the second output sub-circuit 204 can force the potential at the pull-up node PU in the shift register SR[i] to become a low voltage level, thus ensuring that sub-circuits and/or components (e.g., the first output sub-circuit 202 in FIG. 2) whose operating condition is that the potential at the pull-up node is a high voltage level do not operate, so as to prevent these sub-circuits and/or components from possibly affecting the potential at the output terminal OUT because of operating.

The second output sub-circuit 204 may also have additional components or adopt other circuit configurations to achieve the corresponding function. An example of the second output sub-circuit 204 will be described below in conjunction with FIG. 3.

In another example, the shift register SR[i] according to an embodiment of the present disclosure may further comprise a reset sub-circuit 203, the reset sub-circuit 203 is coupled to a reset terminal, the pull-up node and the output terminal of the shift register, and sets potentials at the pull-up node and the output terminal to a reset potential when a reset signal is received via the reset terminal. Specifically, as shown in FIG. 2, the reset sub-circuit 203 may comprise a first reset sub-circuit 2031 and a second reset sub-circuit 2032, wherein the first reset sub-circuit 2031 is coupled to the reset terminal RESET and the pull-up node PU of the shift register SR[i], the second reset sub-circuit 2032 is coupled to the reset terminal RESET and the output terminal OUT of the shift register SR[i]. When the reset signal is received via the reset terminal RESET, the first reset sub-circuit 2031 and the second reset sub-circuit 2032 operate and set the potentials at the pull-up node PU and the output terminal OUT to a low voltage level, respectively.

In an example, the first reset sub-circuit 2031 and the second reset sub-circuit 2032 may each comprise a switching element. For example, a control terminal of the switching element in the first reset sub-circuit 2031 and a control terminal of the switching element in the second reset sub-circuit 2032 may be coupled together as the reset terminal RESET of the shift register SR[i] or to be coupled to the reset terminal RESET of the shift register SR[i]; potentials at a first terminal of the switching element in the first reset sub-circuit 2031 and a first terminal of the switching element in the second reset sub-circuit 2032 are set to a low voltage level (e.g., it may be coupled to the reset potential terminal of the shift register SR[i], so that their potentials are always at a low voltage level); and a second terminal of the switching element in the first reset sub-circuit 2031 and a second terminal of the switching element in the sub-circuit 2032 are coupled to the pull-up node PU and the output terminal OUT, respectively. Accordingly, when the reset signal is received via the reset terminal RESET, both switching elements of the first reset sub-circuit 2031 and the second reset sub-circuit 2032 are turned on, so that potentials at the pull-up node PU and the output terminal OUT become a low voltage level. The reset signal may be supplied after the received first clock signal is at a high voltage level, so that the shift register SR[i] can, after outputting the gate driving signal Scan[i], in response to the received reset signal, reset the potentials at the pull-up node PU and the output terminal OUT to a low voltage level.

The reset sub-circuit 203 may also have other variants. For example, the reset sub-circuit 203 may comprise a pull-down node PD, and the control terminal, the first terminal, and the second terminal of the switching element in the second reset sub-circuit 2032 may be coupled to the pull-down node PD, the output terminal OUT and the reset potential terminal of the shift register SR[i], respectively. In an example, additional elements (not shown in FIG. 2) may be disposed between, for example, the reset terminal RESET and the pull-down node PD in the reset sub-circuit 203, so as to assist in controlling the potential at the pull-down node PD to be at a high voltage level when the shift register SR[i] receives the reset signal. In another example, the reset sub-circuit 203 may also comprise only one of the first reset sub-circuit 2031 and the second reset sub-circuit 2032 to reset only one of the pull-up node PU and the output terminal OUT. The present disclosure does not limit implementation manner of the reset sub-circuit 203. An example of the reset sub-circuit 203 will be described below in conjunction with FIG. 3.

In an example, as shown by the dashed line between the pull-up sub-circuit 201 and the second reset sub-circuit 2032 in FIG. 2, the pull-up sub-circuit 201 and the second reset sub-circuit 2032 may be connected together (at the pull-down node PD). Accordingly, the pull-up sub-circuit 201 can control the potential at the pull-down node PD upon receiving the first input signal, thereby allowing or disabling the second reset sub-circuit 2032 to operate as needed. For example, in an example, the pull-up sub-circuit 201 may set the potential at the pull-down node PD to a high voltage level upon receiving the first input signal, thereby causing the second reset sub-circuit 2032 to operate, so as to ensure that no gate driving signal Scan[i] is outputted at the output terminal OUT when the pull-up sub-circuit 201 receives the first input signal. In a further example, for example, for some design and/or functional considerations, the pull-up sub-circuit 201 may also be configured to set the potential at the pull-down node PD to a low voltage level upon receiving the first input signal, thereby disabling the second reset sub-circuit 2032 from operating, so as to prevent the second reset sub-circuit 2032 or the reset sub-circuit 203 from possibly affecting the output terminal OUT when the shift register SR[i] receives the first input signal, an example of such configuration will be described below in conjunction with FIG. 3.

In another example, in the second output sub-circuit 204, in the case where the pull-down node PD is included in the reset sub-circuit 203, as shown by the dotted line between the second output sub-circuit 204 and the pull-down node PD in FIG. 2, the corresponding switching element may be provided for the pull-down node PD. A control terminal and a first terminal of the switching element may be coupled to the second input terminal IN2 and the pull-down node PD of the shift register SR[i], respectively, and a potential at the second terminal of the switching element is set to remain at a low voltage level (e.g., being coupled to the reset potential terminal of the shift register SR[i]). As such, when the second input signal is received via the second input terminal IN2, the second output sub-circuit 204 can force the potential at the pull-down node PD in the shift register SR[i] to become a low voltage level, thus ensuring that sub-circuits and/or components (e.g., the second reset sub-circuit 2031 in FIG. 2) whose operating condition is that the potential at the pull-up node is at a high voltage level do not operate, so as to prevent these sub-circuits and/or components from possibly affecting the potential at the output terminal OUT because of operating.

Figure 3:
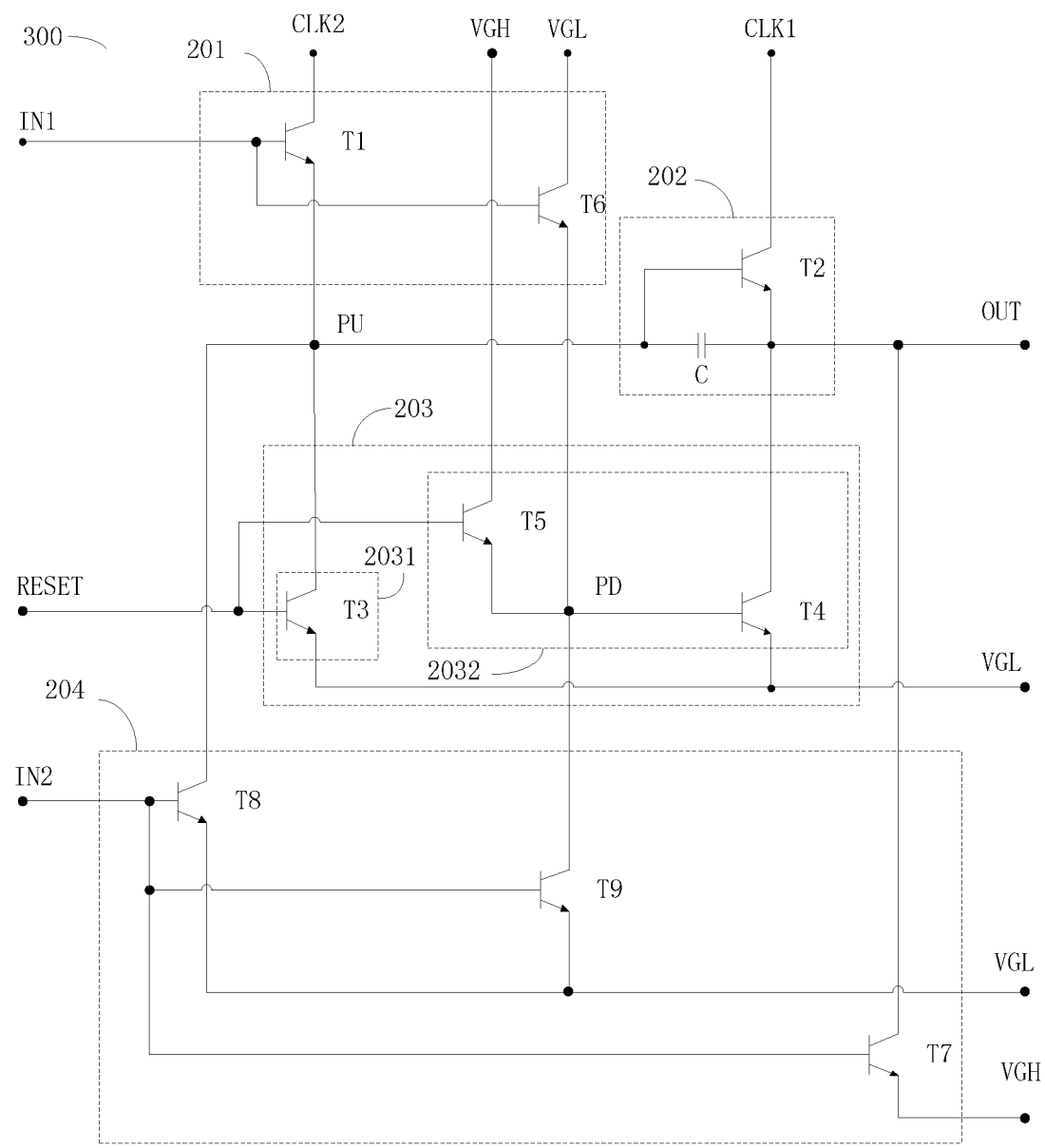
FIG. 3 illustrates an example of circuit of a shift register according to an embodiment of the present disclosure.

FIG. 3 illustrates an exemplary circuit 300 of a shift register according to an embodiment of the present disclosure. For convenience of description, it is assumed that all the switching elements in the circuit 300 are thin film transistors (hereinafter simply referred to as transistors) having the same channel type, and for each transistor, the gate thereof is equivalent to the control terminal of the switching element, one of the source and the drain thereof is equivalent to the first terminal of the switching element, and the other of the source and the drain thereof is equivalent to the second terminal of the switching element, and the transistor is turned on when the potential at the gate thereof is a high voltage level, and turned off when the potential at the gate thereof is a low voltage level. However, circuit structure of the shift register according to an embodiment of the present disclosure and the type of the element adopted in the shift register are not limited to the example shown in FIG. 3, there may be other variants. For example, the switching element may also adopt various switching elements such as MOS transistor with a control terminal, and each sub-circuit may also adopt other structure than those shown in FIG. 3.

In FIG. 3, the pull-up sub-circuit 201 comprises a first pull-up transistor T1 whose gate, source and drain are coupled to the first input terminal IN1, the second clock signal terminal CLK2 and the pull-up node PU of the shift register 300, respectively. The pull-up sub-circuit 201 may further comprise a second pull-up transistor T6 whose gate, source and drain are coupled to the first input terminal IN1, the reset potential terminal VGL and the pull-down node PD of the shift register 300, respectively.

The second output sub-circuit 204 comprises a first output transistor T7 whose gate, source and drain are coupled to the second input terminal IN2, the output terminal OUT and the operating potential terminal VGH of the shift register 300, respectively. In addition, in the second output sub-circuit 204 shown in FIG. 3, a first pull-down transistor T8 may be further provided for the pull-up node PU, and a gate, a source and a drain of the first pull-down transistor T8 are coupled to the second input terminal IN2, the pull-up node PU, and the reset potential terminal VGL of the shift register 300, respectively. In addition, in the second output sub-circuit 204 shown in FIG. 3, a second pull-down transistor T9 is further provided for the pull-down node PD, and a gate, a source and a drain of the second pull-down transistor T9 are coupled to the second input terminal IN2, the pull-down node PD and the reset potential terminal VGL of the shift register 300, respectively.

The first output sub-circuit 202 comprises a second output transistor T2 and a capacitor C, wherein a gate, a source and a drain of the second output transistor T2 are coupled to the pull-up node PU, the first clock signal terminal CLK1 and output terminal OUT of the shift register 300, respectively, the capacitor C is connected between the pull-up node PU and the output terminal OUT.

The first reset sub-circuit 2031 in the reset sub-circuit 203 comprises a first reset transistor T3 whose gate, source and drain are coupled to the reset terminal RESET, the pull-up node PU and the reset potential terminal VGL of the shift register 300, respectively. The second reset sub-circuit 2032 in the reset sub-circuit 203 comprises a second reset transistor T4 whose gate, source and drain are coupled to the pull-down node PD, the output terminal OUT and the reset potential terminal VGL of the shift register 300, respectively. In addition, in the shift register 300 shown in FIG. 3, the second reset sub-circuit 2032 in the reset sub-circuit 203 may further comprise a third reset transistor T5 whose gate, source and drain are coupled to the reset terminal RESET, the operating potential terminal VGH and the pull-down node PD of the shift register 300, respectively.

As used herein, the terms "first terminal" and "second terminal" of the elements referred are interchangeable, and the terms "first terminal" and "second terminal" are used for convenience of description only, not for purpose of limitation. In addition, the modifiers "first", "second" and the like are used to distinguish different sub-circuits/components/items, not to limit the order, priority, etc. of the sub-circuits/components/items referred.

Figure 4:
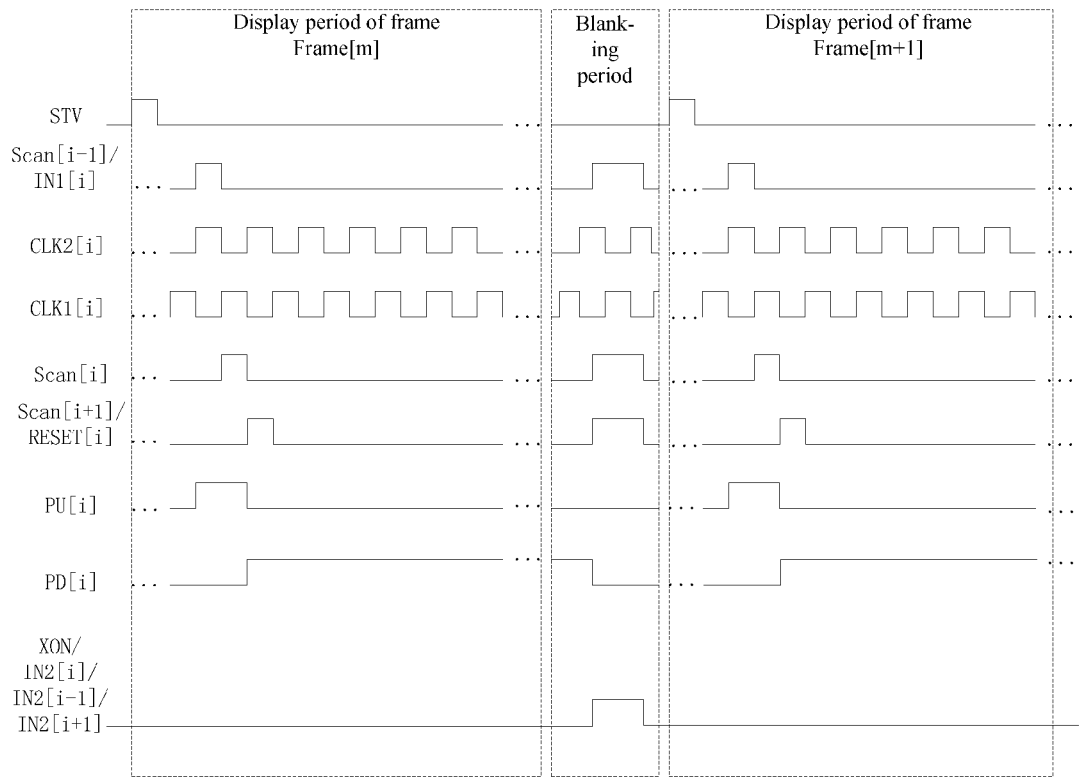
FIG. 4 illustrates an example of operational timing sequence of a shift register according to an embodiment of the present disclosure.

Operational timing sequence of the shift register according to an embodiment of the present disclosure will be described below with reference to FIGS. 1, 3 and 4. In this example, the shift register in the gate driving circuit 140 of FIG. 1 adopts the exemplary circuit structure shown in FIG. 3. FIG. 4 shows operational timing sequence of the shift register SR[i] in the gate driving circuit 140 of FIG. 1 during a display period of one frame (Frame[m] or Frame[m+1], where m is a positive integer), and also shows operational timing sequence of any three shift registers SR[i−1], SR[i] and SR[i+1] in the gate driving circuit 140 in a blanking period between two successive frames (Frame [m] and Frame [m+1]).

As shown in FIG. 4, when the shift register SR[1] cascaded at the first stage in the gate driving circuit 140 receives the frame start signal STV of the frame Frame[m] or Frame[m+1] via its first input terminal IN1, displaying of one frame (Frame[m] or Frame[m+1]) of picture is started.

During a display period of one frame, for the shift register SR[i] cascaded at the i-th stage in the gate driving circuit 140, its operation process may be roughly divided into four phases: an input phase, an output phase, a reset phase and a holding stage.

As shown in FIGS. 1, 3 and 4, the shift register SR[i] receives, via its first input terminal IN1, the gate driving signal Scan[i−1] (if i=1, alternatively, it receives the frame start signal STV) outputted by the shift register SR[i−1] cascaded at its previous stage, as its first input signal IN[i], while receiving the second clock signal CLK2[$i$] via its second clock signal terminal CLK2, thereby entering the input phase.

In response to the received first input signal IN[i] and the second clock signal CLK2[$i$], the first pull-up transistor T1 in the pull-up sub-circuit 201 of the shift register SR[i] is turned on, so that the potential PU[i] at the pull-up node PU in the shift register SR[i] becomes a high voltage level. The first output sub-circuit 202 of the shift register SR[i] starts operating due to that the potential at the pull-up node PU becomes a high voltage level, causing the second output transistor T2 to be turned on and the capacitor C to start to be charged. However, as shown in FIG. 4, the first output sub-circuit 202 has not received the first clock signal CLK1 [$i$] via the first clock signal terminal CLK1 at this time, or the potential at one terminal of the second output transistor T2 coupled to the first clock signal terminal CLK1 is a low voltage level at this time, thus the potential at the terminal of the second output transistor T2 coupled to the output terminal OUT is also at a low voltage level at this time. Accordingly, in this case, there is no gate driving signal Scan[i] outputted at the output terminal OUT of the shift register SR[i].

In addition, as shown in FIG. 3, in the input phase, the second pull-up transistor T6 in the pull-up sub-circuit 201 is also turned on because of receiving the first input signal IN[i], so that the potential PD[i] at the pull-down node PD in the shift register SR[i] is at a low voltage level, thus the second reset transistor T4 in the first reset sub-circuit 2032 of the shift register SR[i] is turned off. In addition, at this time, the first reset transistor T3 and the third reset transistor T5 in the reset sub-circuit 203 of the shift register SR[i] have not received the reset signal RESET [i] (i.e., the gate driving signal Scan[i+1] outputted by the shift register SR[i+1] cascaded at the next stage of the shift register SR[i] in the gate driving circuit 140) via the reset terminal RESET of the shift register SR[i], thus they are still in a turned-off state; and the first output transistor T7, the first pull-down transistor T8 and the second pull-down transistor T9 in the second output sub-circuit 204 are also in a turned-off state because of having not received the second input signal XON via the second input terminal IN2 of the shift register SR[i], so that the influence on displaying of the liquid crystal display 10 in FIG. 1 can be avoided.

As shown in FIG. 4, in the input phase, Scan[i−1]/IN1[i] and CLK2[i] are a high voltage level, PU[i] is a high voltage level, and Scan[i] and PD[i] still are a low voltage level.

Thereafter, the potential PU[i] at the pull-up node PU in the shift register SR[i] is kept at a high voltage level by the bootstrap effect of the capacitor C in the first output sub-circuit 202 (may even be further pulled high), and the second output transistor T2 in the first output sub-circuit 202 is thus still kept in a turned-on state. In this state, upon receiving the first clock signal CLK1[i], the shift register SR[i] enters the output phase.

In the output phase, the potential at the terminal of the second output transistor T2 coupled to the output terminal OUT of the shift register SR[i] also becomes a high voltage level, thereby outputting the gate driving signal Scan[i] at the output terminal OUT. In the output phase, transistors in the pull-up sub-circuit 201, the reset sub-circuit 203 and the second output sub-circuit 204 of the shift register SR[i] are all in a turned-off state, thus ensuring that the gate driving signal Scan[i] is normally outputted.

As shown in FIG. 4, during the output phase, CLK1[i] becomes a high voltage level, PU[i] continues to remain at a high voltage level, and Scan[i] becomes a high voltage level, the other signals are of a low voltage level.

Next, when the shift register SR[i] receives the reset signal RESET[i] via the reset terminal RESET, that is, upon receiving the gate driving signal Scan[i+1] outputted by the stage shift register SR[i+1] cascaded at the next stage of the shift register SR[i] in the gate driving circuit 140, the reset sub-circuit 203 of the shift register SR[i] starts to operate and accordingly enters the reset phase. The first reset transistor T3 in the first reset sub-circuit 2031 is turned on, so that the potential PU[i] at the pull-up node PU becomes a low voltage level, thereby realizing resetting of the potential at the pull-up node PU. Meanwhile, the third reset transistor T5 in the second reset sub-circuit 2032 is also turned on, so that the potential PD[i] at the pull-down node PD becomes a high voltage level, and further causes the second reset transistor T4 in the second reset sub-circuit 2032 to be turned on, thereby causing the potential Scan[i] at the output terminal OUT to become a low voltage level, thus realizing resetting of the potential at the output terminal OUT.

In the reset phase, the transistors in the pull-up sub-circuit 201, the first output sub-circuit 202 and the second output sub-circuit 204 of the shift register SR[i] are all in a turned-off state, thus ensuring that the reset function is achieved.

As shown in FIG. 4, in the reset phase, Scan[i+1]/RESET[i] and PD[i] become a high voltage level, and Scan[i] and PU[i] become a low voltage level.

Subsequently, in the shift register SR[i], the potential PU[i] at the pull-up node PU is kept at a low voltage level, and the potential PD[i] at the pull-down node PD is kept at a high voltage level, so that the second output transistor T2 in the first output sub-circuit in 202 is kept in a turned-off state, and the second reset transistor T4 in the second reset sub-circuit 2032 is kept in a turned-on state, thus causing the potential Scan[i] at the output terminal OUT to remain at a low voltage level state until the frame start signal STV of the next frame Frame[m+1] is received. This phase may be referred to as the holding phase.

When the frame start signal STV of the next frame Frame[m+1] is received, the shift register SR[i] will repeat the above four phases.

According to the above process, each shift register SR[i] in the gate driving circuit 140 sequentially supplies the gate driving signal Scan[i] to the scan line in the order of being cascaded, so that all the pixel cells in the display area 110 in the liquid crystal display device 10 display progressively, thereby the display function is achieved according to the data signal Data[j] supplied via the data signal supply circuit 120.

In a period other than a duration in which one frame of picture is displayed, for example, in a blanking period between two successive frames Frame [m] and Frame[m+1] in the example shown in FIG. 4, a control signal XON is supplied to the second input terminal IN2 of each shift register in the gate driving circuit 140, as a second input signal to the shift register. For the shift register SR[i], as shown in FIGS. 3 and 4, when it receives the second input signal IN2[i], the first output transistor T7, the first pull-down transistor T8 and the second pull-down transistor T9 in the second output sub-circuit 204 are all turned on. Turn-on of the first output transistor T7 causes the potential Scan[i] at the output terminal OUT to become a high voltage level, thereby realizing outputting of the gate driving signal Scan[i] by the shift register SR[i] during this period. Turn-on of the first pull-down transistor T8 and the second pull-down transistor T9 causes the potential PU[i] at the pull-up node PU and the potential PD[i] at the pull-down node PD to become a low voltage level, thereby turning off the transistors that can operate only when PU[i] or PD[i] is a high voltage level in the first output sub-circuit 202 and the reset sub-circuit 203, thus preventing these transistors or sub-circuits from affecting the output terminal OUT at this period. Operation process of the shift register SR[i−1] and the shift register SR[i+1] during this period is similar to that of the shift register SR[i]. As shown in FIG. 4, during this period, Scan[i−1], Scan[i] and Scan[i+1] all become a high voltage level because that XON becomes a high voltage level, meanwhile PD and PU[i] (as well as PD[i−1] & PU[i−1], PD[i+1] & PU[i+1], respectively corresponding to shift registers SR[i−1], SR[i+1], not shown in FIG. 4) are all a low voltage level.

Thus, all the shift registers in the gate driving circuit 140 shown in FIG. 1 output a gate driving signal to the corresponding scan line during a period other than a duration in which one frame of picture is displayed, so that transistors within all the pixel cells in the display area 110 are turned on simultaneously or nearly simultaneously. During this period, the data signal supply circuit 120 can supply the data signal Data' [i] (not shown in FIG. 1) to the data line under control of the timing control circuit 130. In an example, the data signal Data' [i] can be made to have the same voltage as the voltage supplied to the common electrode of P[i,j] (e.g., the voltage supplied via line Lcom in FIG. 1). Accordingly, the pixel electrode and the common electrode of all the pixel cells P[i, j] in the display area can have the same voltage, thereby causing the pixel capacitor 102 and the storage capacitor 103 in all the pixel cells P[i, j] in the display area to be sufficiently discharged during this period.

A pulse width and/or amplitude of the control signal XON may be determined according to the number of shift registers in the gate driving circuit 140, so as to ensure that the second output sub-circuit of each of all the shift registers in the gate driving circuit 140 can operate normally when the control signal XON is received via its second input terminal IN2.

In an example, the shift registers in the gate driving circuit 140 may also be grouped, then a corresponding second input signal or a corresponding control signal XON is supplied for each group of shift registers. In this case, the corresponding second input signal or the corresponding control signal XON may be supplied to each group of shift registers simultaneously or almost simultaneously under control of the timing control circuit 130; the corresponding second input signal or the corresponding control signal XON may also be asynchronously supplied to each group of shift registers during a period other than a duration in which one frame of picture is displayed, as long as all the shift registers are enabled to output the gate driving signals during this period.

In a further example, the second input signal XON may be supplied to the shift registers in the gate driving circuit 140 during any time period other than a duration in which one frame of picture is displayed, such as before powering on or after powering off.

Figure 5:
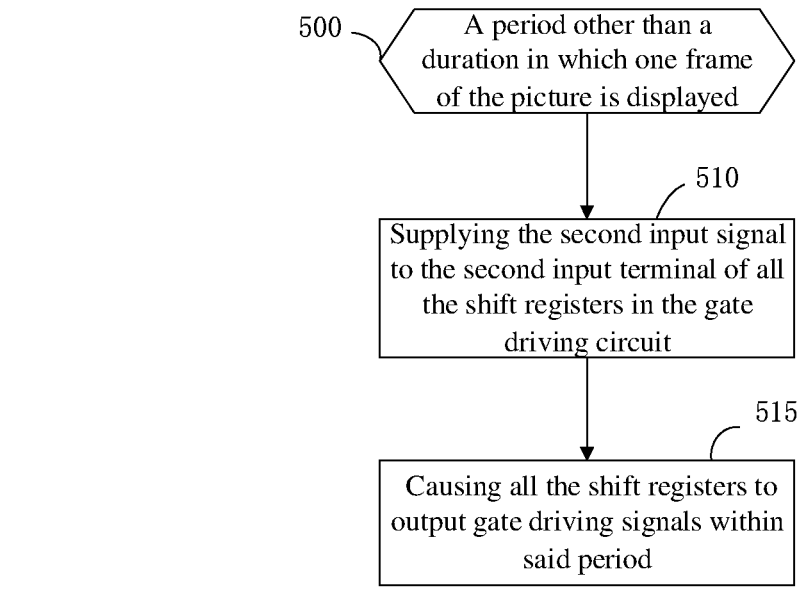
FIG. 5 illustrates a flowchart of a driving method for a gate driving circuit during a period other than a duration in which one frame of picture is displayed according to an embodiment of the present disclosure.

FIG. 5 illustrates a flowchart of a driving method for a gate driving circuit during a period other than a duration in which one frame of picture is displayed according to an embodiment of the present disclosure, wherein the gate driving circuit comprises a plurality of cascaded shift registers, each shift register is provided with the second input terminal IN2 and includes the second output sub-circuit 204 as described with reference to FIGS. 2 and 3.

The method shown in FIG. 5 starts at step 500, this time is a certain period other than a duration in which one frame of the picture is displayed, for example, a blanking period between two frames as described above or before powering on or after powering off. At step 510, the second input signal or the control signal XON is supplied to the second input terminal IN2 of all the shift registers in the gate driving circuit. At step 515, each of all the shift registers outputs a gate driving signal at the output terminal OUT of the shift register in response to receipt of the second input signal at the second input terminal IN2.

In the shift register of the present disclosure, the second output sub-circuit is provided, so that the shift register can control the gate driving signal to be outputted at the output terminal thereof through the received second input signal alone. A gate driving circuit composed of such shift register can, during a period other than a duration in which one frame of picture is displayed, for example, during a blanking period between two frames and/or before powering on and/or after powering off, by supplying the second input signal to all the shift registers in the gate driving circuit, enable all the shift registers to output gate driving signals at output terminals thereof during this period, and cause switching elements in all pixel cells in a display area to be turned on during this period. Accordingly, the pixel capacitors and the storage capacitors of all the shift registers can be sufficiently discharged during this period, so that occurrence of phenomenon such as afterimage, jitter, and flickering at the time of power on/off can be effectively avoided.

Figure 6:
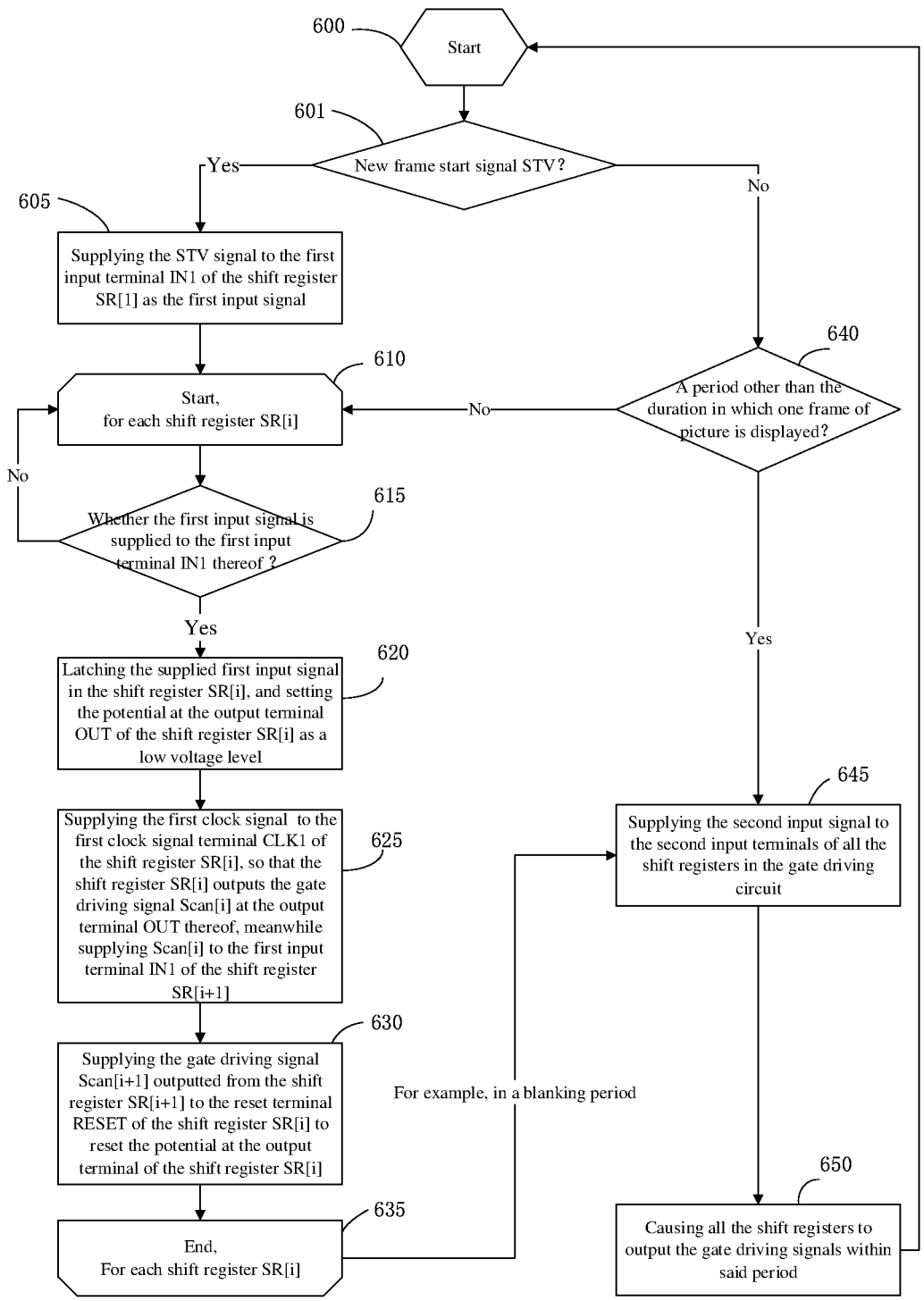
FIG. 6 illustrates a flowchart of a driving method for a gate driving circuit according to an embodiment of the present disclosure.

FIG. 6 illustrates a flowchart of an exemplary driving method for a gate driving circuit according to the present disclosure, including the driving process of the gate driving circuit during a duration in which one frame of picture is displayed and the driving process of the gate driving circuit during a period other than the duration in which one frame of picture is displayed. Herein, the gate driving signal outputted by the gate driving circuit (or each shift register in the gate driving circuit) during the duration in which one frame of picture is displayed is also referred to as the first gate driving signal, and the gate driving signal outputted by the gate driving circuit (or each shift register in the gate driving circuit) during the period other than the duration in which one frame of picture is displayed is also referred to as the second gate driving signal. As mentioned above, the modifiers "first", "second", etc. used are only to distinguish between gate driving signals outputted during different time periods. In the case of causing no confusion, this distinction may not be made herein. For example, the first gate driving signal and the second gate driving signal may both be at a high voltage level, thus ensuring that the transistors inside the pixel cells controlled by the scan line can be turned on normally when the first or second gate driving signal is outputted to the corresponding scan line.

The method as shown in FIG. 6 begins at step 600. In step 601, it is checked whether a new frame start signal STV is supplied to the gate driving circuit. If yes, the method continues to step 605, the STV signal is supplied to the first input terminal IN1 of the shift register SR[1] cascaded at the first stage in the gate driving circuit, and it enters the display process of displaying one frame of picture. During the display process of displaying one frame of picture, processing is performed for each shift register SR[i] in the gate driving circuit by the steps between steps 610 and 635.

For each shift register SR[i], at steps 615 and 620, the shift register SR[i] receives, via its first input terminal IN1, a first input signal (e.g., a frame start signal, or e.g. a gate driving signal Scan[i−1] from the shift register SR[i−1] cascaded at the previous stage of the shift register SR[i]), and it enters the input phase. In the input phase, the shift register SR[i] does not output the gate driving signal Scan[i], but latches the received first input signal. Subsequently, at step 625, the first clock signal CLK1 is supplied to the first clock signal terminal CLK1 of the shift register SR[i]. The shift register SR[i] outputs the gate driving signal Scan[i] at its output terminal OUT in response to the received first clock signal and according to the first input signal previously latched. Step 625 may correspond to the output phase of the shift register SR[i]. Further, in the output phase, the gate driving signal Scan[i] outputted by the shift register SR[i] is also supplied to, for example, the first input terminal IN1 of the shift register SR[i+1] cascaded at the next stage of the shift register SR[i], to serve as the first input signal of the shift register SR[i+1]. Subsequently, at step 630, the gate driving signal Scan[i+1] outputted by the shift register SR[i+1] is supplied to the reset terminal RESET of the shift register SR[i]. In response to receipt of the reset signal at the reset terminal RESET, the shift register SR[i] enters the reset phase and resets the potential at the output terminal OUT to a low voltage level. Each shift register SR[i] in the gate driving circuit repeats the steps between steps 610 and 635 to supply the gate driving signal Scan[i] to the corresponding scan line stage by stage.

After all the shift registers have completed outputting of the gate driving signal, such as during the blanking period, the method may proceed to step 645. At step 645, a second input signal or a control signal XON is supplied to the second input terminals of all the shift registers in the gate driving circuit. At step 650, each of the shift registers in the gate driving circuit causes its internal second output sub-circuit to operate in response to receipt of the second input signal or the control signal XON received via its second input terminal IN2, thereby outputting the gate driving signal at the output terminal during this period. The method may then return to the start step 600 and wait for a new frame start signal STV at step 601.

If it is determined at step 601 that no new frame start signal STV is supplied to the gate driving circuit, the method may continue to step 640 to determine whether it is currently within a certain time period other than the duration in which one frame of picture is displayed. If not, it means that processing of one frame of picture for the gate driving circuit is not completed yet, thus the process proceeds to step 610.

If yes, it may proceed directly to step 645 to supply the second input signal or the control signal XON to the second input terminal of all the shift registers in the gate driving circuit.

Accordingly, all the shift registers in the gate driving circuit can output the gate driving signals to the corresponding scan lines in a period other than the duration in which one frame of picture is displayed, so that transistors of all the pixel cells in the display area of the liquid crystal display are turned on simultaneously or almost simultaneously, and during this period, data signals may be supplied to the data lines, for example, the supplied data signals may be made to have the same voltage as the voltage supplied to the common electrodes of the pixel cells, so that the pixel capacitors and the storage capacitors in all the pixel cells in the display area can be sufficiently discharged in this period, so that occurrence of phenomena such as afterimage, jitter, and flickering at the time of powering on/off can be effectively avoided.

Some embodiments of the present disclosure have been described above. However, the present disclosure is not limited to these examples described, various modifications and improvements may be made, and such modifications and improvements are also within the scope of the present disclosure.

What is claimed is:

1. A shift register, comprising:
   a pull-up sub-circuit coupled to a first input terminal and a pull-up node of the shift register, and configured to set a potential at the pull-up node to an operating potential when a first input signal is received via the first input terminal;
   a first output sub-circuit coupled to the pull-up node, a first clock signal terminal, and an output terminal of the shift register, and configured to output a first gate driving signal at the output terminal according to a first clock signal received via the first clock signal terminal when the potential at the pull-up node is the operating potential;
   a reset sub-circuit coupled to a reset terminal, the pull-up node, and the output terminal of the shift register, and configured to set potentials at the pull-up node and the output terminal to a reset potential when a reset signal is received via the reset terminal; and
   a second output sub-circuit coupled to a second input terminal and the output terminal of the shift register, and configured to output a second gate driving signal at the output terminal when a second input signal is received via the second input terminal during a period other than a duration in which one frame of picture is displayed to set potentials at the pull-up node and a pull-down node of the shift register to the reset potential,
   wherein the second output sub-circuit comprises:
   a first output switching element, a control terminal, a first terminal, and a second terminal of which are coupled to the second input terminal, the output terminal, and an operating potential terminal of the shift register, respectively;
   a first pull-down switching element, a control terminal, a first terminal, and a second terminal of which are to coupled the second input terminal, a reset potential terminal, and the pull-up node of the shift register, respectively; and
   a second pull-down switching component, a control terminal, a first terminal, and a second terminal of which are coupled to the second input terminal, the reset potential terminal, and the pull-down node of the shift register, respectively.

2. The shift register according to claim 1, wherein the pull-up sub-circuit comprises:
   a first pull-up switching element, a control terminal, a first terminal, and a second terminal of which are coupled to the first input terminal, a second clock signal terminal, and the pull-up node of the shift register, respectively.

3. The shift register according to claim 2, wherein the pull-up sub-circuit further comprises:
   a second pull-up switching element, a control terminal, a first terminal, and a second terminal of which are coupled to the first input terminal, the reset potential terminal, and the pull-down node of the shift register, respectively.

4. The shift register according to claim 1, wherein the first output sub-circuit comprises:
   a second output switching element, a control terminal, a first terminal, and a second terminal of which are coupled to the pull-up node, the first clock signal terminal, and the output terminal of the shift register, respectively; and
   a capacitor connected between the pull-up node and the output terminal.

5. The shift register according to claim 1, wherein the reset sub-circuit comprises:
   a first reset switching element, a control terminal, a first terminal, and a second terminal of which are coupled to the reset terminal, the reset potential terminal, and the pull-up node of the shift register, respectively; and
   a second reset switching element, a control terminal, a first terminal, and a second terminal of which are coupled to the pull-down node, the reset potential terminal, and the output terminal of the shift register, respectively.

6. The shift register according to claim 5, wherein the reset sub-circuit further comprises:
   a third reset switching element, a control terminal, a first terminal, and a second terminal of which are coupled to the reset terminal, the operating potential terminal, and the pull-down node of the shift register, respectively.

7. A gate driving circuit, comprising a plurality of cascaded shift registers, each of the shift registers comprising:
   a pull-up sub-circuit coupled to a first input terminal and a pull-up node of the shift register, and configured to set a potential at the pull-up node to an operating potential when a first input signal is received via the first input terminal;
   a first output sub-circuit coupled to the pull-up node, a first clock signal terminal, and an output terminal of the shift register, and configured to output a first gate driving signal at the output terminal according to a first clock signal received via the first clock signal terminal when the potential at the pull-up node is the operating potential;
   a reset sub-circuit coupled to a reset terminal, the pull-up node, and the output terminal of the shift register, and configured to set potentials at the pull-up node and the output terminal to a reset potential when a reset signal is received via the reset terminal, and
   a second output sub-circuit coupled to a second input terminal and the output terminal of the shift register, and configured to output a second gate driving signal at the output terminal when a second input signal is received via the second input terminal during a period other than a duration in which one frame of picture is displayed to set potentials at the pull-up node and a pull-down node of the shift register to the reset potential, wherein the second output sub-circuit comprises:

a first output switching element, a control terminal, a first terminal, and a second terminal of which are coupled to the second input terminal, the output terminal, and an operating potential terminal of the shift register, respectively;

a first pull-down switching element, a control terminal, a first terminal, and a second terminal of which are to the second input terminal, a reset potential terminal, and the pull-up node of the shift register, respectively; and a second pull-down switching component, a control terminal, a first terminal, and a second terminal of which are coupled to the second input terminal, the reset potential terminal, and the pull-down node of the shift register, respectively.

8. A driving method for the gate driving circuit according to claim 7, comprising: during the period other than the duration in which the one frame of picture is displayed, supplying the second input signal to second input terminals of all the shift registers in the gate driving circuit, and outputting, by each of all the shift registers, a second gate driving signal at its output terminal within said period in response to the second input signal received via its second input terminal.

9. The gate driving circuit according to claim 7, wherein the pull-up sub-circuit comprises:

a first pull-up switching element, a control terminal, a first terminal, and a second terminal of which are coupled to the first input terminal, a second clock signal terminal, and the pull-up node of the shift register, respectively.

10. The gate driving circuit according to claim 9, wherein the pull-up sub-circuit further comprises:

a second pull-up switching element, a control terminal, a first terminal, and a second terminal of which are coupled to the first input terminal, the reset potential terminal, and the pull-down node of the shift register, respectively.

11. The shift register according to claim 7, wherein the first output sub-circuit comprises:

a second output switching element, a control terminal, a first terminal, and a second terminal of which are coupled to the pull-up node, the first clock signal terminal, and the output terminal of the shift register, respectively; and a capacitor connected between the pull-up node and the output terminal.

12. The gate driving circuit according to claim 7, wherein the reset sub-circuit comprises:

a first reset switching element, a control terminal, a first terminal, and a second terminal of which are coupled to the reset terminal, the reset potential terminal, and the pull-up node of the shift register, respectively;

a second reset switching element, a control terminal, a first terminal and a second terminal of which are coupled to the pull-down node, the reset potential terminal and the output terminal of the shift register, respectively; and a third reset switching element, a control terminal, a first terminal and a second terminal of which are coupled to the reset terminal, the operating potential terminal and the pull-down node of the shift register, respectively.

* * * * *